US006791072B1

(12) United States Patent
Prabhu

(10) Patent No.: US 6,791,072 B1
(45) Date of Patent: Sep. 14, 2004

(54) METHOD AND APPARATUS FOR FORMING CURVED IMAGE SENSOR MODULE

(75) Inventor: Ashok Prabhu, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 84 days.

(21) Appl. No.: 10/153,974

(22) Filed: May 22, 2002

(51) Int. Cl.[7] .......................................... H01L 31/0203
(52) U.S. Cl. ..................... 250/208.1; 250/239; 257/433
(58) Field of Search ............................. 250/208.1, 239, 250/216; 257/432, 433, 434, E21.499, E21.5, E21.502

(56) References Cited

U.S. PATENT DOCUMENTS 5,510,273 A * 4/1996 Quinn ........................ 156/160
5,818,035 A * 10/1998 Krivanek et al. ......... 250/208.1

2001/0020671 A1 * 9/2001 Ansorge et al. .......... 250/208.1

* cited by examiner

Primary Examiner—Kevin Pyo
(74) Attorney, Agent, or Firm—Beyer Weaver & Thomas LLP

(57) ABSTRACT

An image sensor module includes a flexible support mounted with a flexible substrate that includes optical circuitry on its surface. The substrate is formed sufficiently thin so that it can be shaped into a curved configuration. The combination of substrate and support can be mounted inside an optically transmissive housing and shaped into a variety of curved configurations that match the curved focal surface of a lens. In another approach, the support is a rigid support having a curved surface contour that substantially corresponds to a curved focal surface of a lens. The substrate is coupled with the curved surface contour of the rigid support and mounted with a lens such that the optical circuitry of the substrate obtains a curve that substantially matches that of the focal surface of the lens. Methodologies for fabricating the above modules are also disclosed.

2 Claims, 5 Drawing Sheets

METHOD AND APPARATUS FOR FORMING CURVED IMAGE SENSOR MODULE

TECHNICAL FIELD

The invention described herein relates generally to image sensor devices and the methods of their manufacture. In particular, the invention relates to methods and structures for creating image sensors devices having curved surface contours.

BACKGROUND

A commonly used conventional image sensor device 100 is schematically depicted in the simplified illustration of FIG. 1. Typically, a substrate 101 has an array of photodiodes 102 (also referred to as "photo arrays" or "photoimagers") formed on the surface of the substrate 101. The methods of forming such photo arrays are well known to those having ordinary skill in the art. Typically, the substrate 101 is mounted to a flat support structure 103 and electrically connected to a plurality of electrical contacts. In the depicted example, the substrate 101 is electrically connected to bond pads 105 of the support structure 103 using wires 104 (e.g., using wire-bonding techniques). The structure is then enclosed in a package 106 with a light transmissive surface 107 that allows light to impinge on the array of photodiodes 102 formed on the surface of the substrate 101. Typically, the foregoing structure 108 is coupled with a lens 110 to improve optical performance.

One of the problems of such photoimagers is that the lenses required to obtain high quality images are relatively expensive. In order to produce a flat image with relatively little distortion or little chromatic aberration requires the implementation of multiple lenses which are arranged to generate a flat optical plane. This can require many expensive optical elements.

Inexpensive lenses are available but they exhibit some undesirable optical properties. One problem is illustrated with respect to FIG. 2 which schematically depicts one type of readily available low cost lens 201. The depicted representation is merely illustrative and is neither to scale nor intended to be strictly limited to any particular lens embodiment. Incident light 202 is received and focused by the lens 201. Such lenses are very effective for focussing light on a single point. However, they are rather less effective at focussing the light at every point in a flat focal plane (depicted here by the flat line 203). Such lenses 201 tend to generate focal surfaces that are not planar (flat).

The focal surface of a lens is defined by a plurality of focal points for the lens wherein light passing through the lens is in focus at each point on the focal surface. In the example depicted in the cross-section view of FIG. 2, a plurality of focal points 205 defines a curved focal surface 204 for the lens 201. The degree and type of curvature is dependent on the lens properties. In some embodiments the focal surface can be parabolic or in others the focal surface can be spherical or cylindrical having a common radius of curvature. Other more complex focal surfaces can also be generated.

Such single element lenses, although inexpensive and relatively easy to manufacture, do not generate flat focal planes. As result, when used with flat image sensors image quality is degraded. This image deterioration is especially severe around the edges of such image sensors. For these and other reasons, such lenses are not generally suitable for use with flat image sensors. Until now, the only solution to these problems has been the implementation of complicated multi-lens structures to generate a flat focal plane that can be used to project light onto the flat surfaces of the photoimagers. Although optically suitable, such implementations have the disadvantage of being much more expensive than single lens element implementations.

What is needed is an image sensor module that can utilize these low cost single element lenses without suffering from excessive degradation of image quality. Also needed are methodologies for fabricating such structures. The principles of the present invention are directed toward an improved image sensor module and methodologies for it fabrication.

SUMMARY OF THE INVENTION

In accordance with the principles of the present invention, the invention includes an image sensor module and methods for its fabrication.

An image sensor module embodiment having a photoimager with a curved surface and methods for its fabrication are disclosed. The image sensor module includes a flexible support with sufficient flexibility so that it can be shaped into a curved configuration. The substrate includes optical circuitry on its surface and is formed sufficiently thin so that it can be shaped into a curved configuration. The substrate is coupled with the flexible support to form a combination can be shaped into a curved configuration that matches a curved focal surface of a lens. This embodiment can be mounted inside an optically transmissive housing and optically coupled with a suitable lens.

In another embodiment, an optical sensor module comprises a rigid support having a curved surface contour that substantially corresponds to a curved focal surface of a lens. A substrate having optical circuitry formed on its surface is provided. The substrate is formed sufficiently thin so that it can be formed into a curved configuration. A lens having a curved focal surface is also provided. The substrate is coupled with the curved surface contour of the rigid support and mounted with the lens such that the optical circuitry of the substrate obtains a curve that substantially matches that of the focal surface of the lens.

In another embodiment the invention comprises a method for forming a curved image sensor. The method includes providing a substrate with optical circuitry formed on a front side, bulk removing material from the back side of the substrate, and precision removal of material from the back side of the substrate until the substrate has a desired thickness enabling the substrate to be shaped into a curved configuration. The substrate is then singulated and coupled with a support. Where the support is rigid, the coupled substrate and support can be mounted with a hosing an optically coupled to a lens. Where the support is flexible, the coupled substrate and flexible support can be curved to match a lens and mounted in a housing.

These and other aspects of the invention will be disclosed in greater detail in the following detailed description.

BRIEF DESCRIPTION OF THE DRAWINGS

The following detailed description will be more readily understood in conjunction with the accompanying drawings, in which.

It is to be understood that in the drawings like reference numerals designate like structural elements. Also, it is understood that the depictions in the drawings are not necessarily to scale.

DETAILED DESCRIPTION OF THE INVENTION

The present invention has been particularly shown and described with respect to certain embodiments and specific features thereof. The embodiments set forth hereinbelow are to be taken as illustrative rather than limiting. It should be readily apparent to those of ordinary skill in the art that various changes and modifications in form and detail may be made without departing from the spirit and scope of the invention.

One aspect of the invention includes the fabrication and implementation of an image sensor having a curved surface. Embodiments of the invention contemplate image sensors where the configuration of the curved surface of the sensor substantially matches that of a focal surface for a lens that is used in conjunction with the image sensor. One such embodiment is discussed with respect to FIG. 3.

Figure 1:
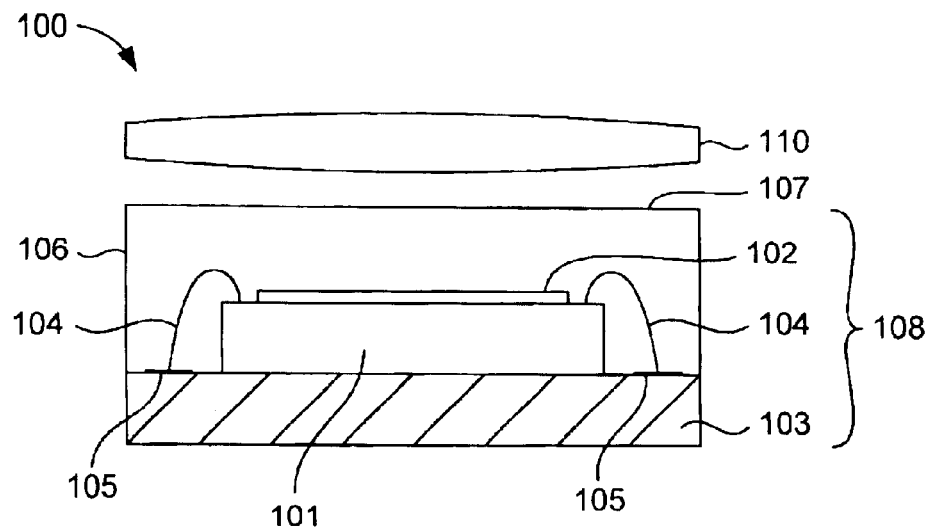
FIG. 1 is a cross section view of a simplified figurative depiction of a conventional photoimaging device.
Figure 2:
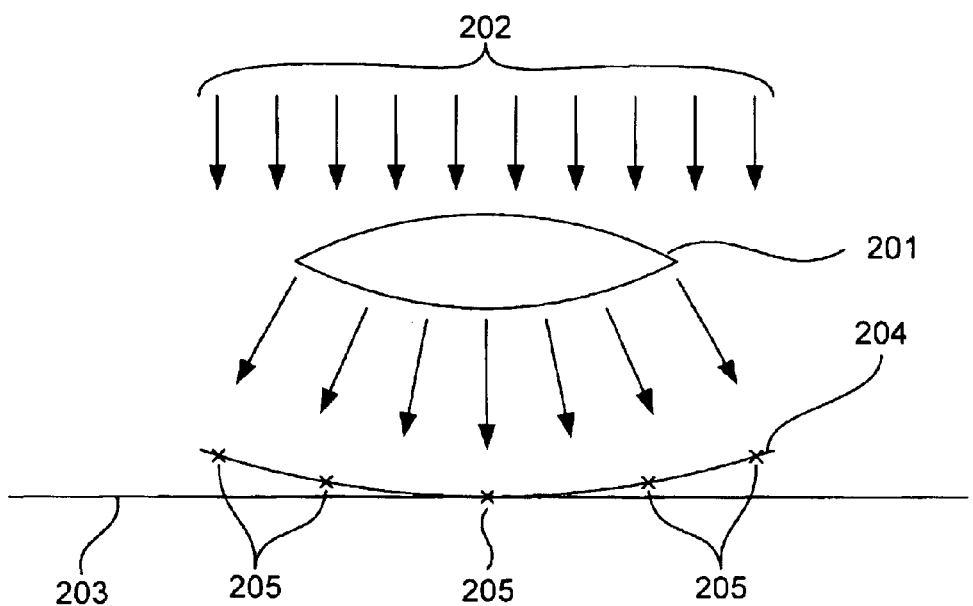
FIG. 2 is a simplified cross-sectional view of a conventional single element lens and an associated focal surface.
Figure 3A:
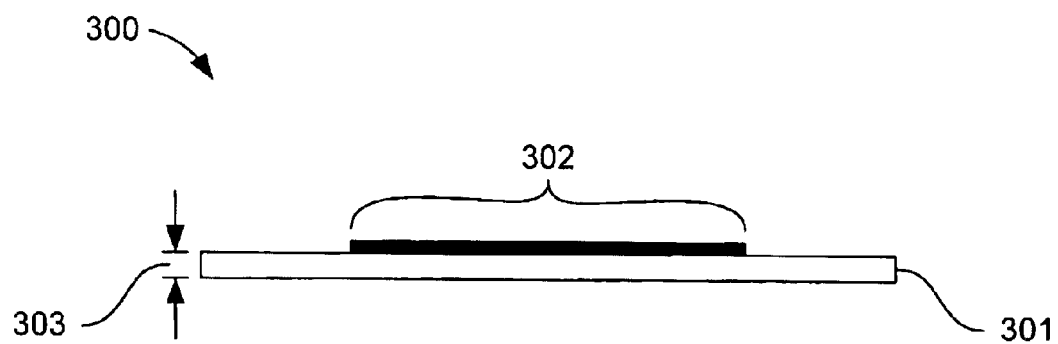
FIGS. 3(a) and 3(b) are cross-section views of a flexible semiconductor substrate embodiment and the relationship of such a substrate to a curved focal surface of a lens implemented in accordance with the principles of the present invention.

FIG. 3(a) depicts an embodiment of a photo imager constructed in accordance with the principles of the present invention. The photo imager 300 comprises a semiconductor substrate 301 having an array of optical elements 302 formed on its top surface. Suitable semiconductor substrate materials include, but are not limited to, silicon (Si), gallium arsenide (GaAs), gallium indium arsenide (GaInAs). These substrate materials may include other semiconductor materials. The optical elements 302 are formed on the top surface of the substrate 301. Commonly, such optical elements include arrays of electronic photo-detector circuitry. Such elements can include arrays of photodiodes, charge coupled devices (CCD's), CMOS devices, and numerous other light sensitive optical detectors. Such devices can be accompanied or replaced by other optical elements including, but not limited to filters, blockers, and reflectors. Additionally, the principles of the present invention can be applied to other optical devices beyond photo imaging devices.

FIG. 3(a) depicts a semiconductor substrate 301 formed having a substantially reduced thickness 303 when compared to substrates of ordinary thickness. A suitable substrate thickness is on the order of about $25\mu$ (micron) to about $125\mu$ thick. Such a thin substrate 301 imparts a certain degree of flexibility to the substrate 301. This thinness and flexibility enables the substrate 301 to be flexed or bent to obtain a desired surface contour.

Figure 3B:
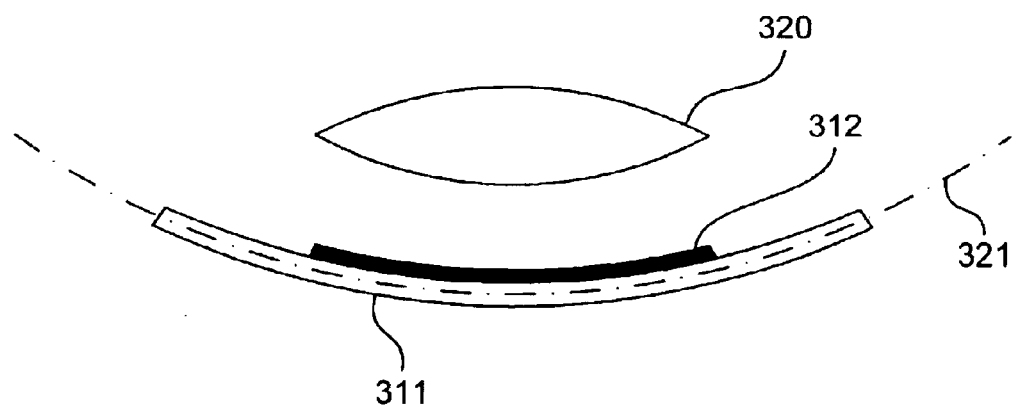

FIG. 3(b) depicts an appropriately thin semiconductor substrate 311 flexed into a curved configuration that substantially conforms with a focal surface 321 of a lens 320. In this way the optical elements 312 of a photoimager can be flexed to match the contour of a focal surface 321 of a lens 320. This flexed photoimager enables a lens having a curved focal surface to produce in-focus images of acceptable quality using low cost lenses.

FIGS. 4(a)–4(d) schematically depict a photoimager embodiment and a method embodiment for its fabrication. In the embodiment schematically depicted in FIG. 4(a), a standard semiconductor wafer 401 is shown with a plurality of photosensitive detector elements 402 formed on a surface of the wafer. In one example, the wafer 401 can be a conventional eight inch silicon wafer about $750\mu$ thick, constructed in accordance with ordinary manufacturing processes known to those having ordinary skill in the art. The photo-sensitive detector elements 402 are commonly photoimager arrays. Other optical or electro-optical components can also be formed on the surface. The photo-sensitive detector elements 402 of the depicted embodiment are formed into photoimager arrays in accordance with conventional fabrication techniques.

Figure 4A:
FIGS. 4(a)–4(d) are cross-section views of a portion of a semiconductor substrate showing a process embodiment used for fabricating flexible substrates in accordance with the principles of the present invention.
Figure 4B:
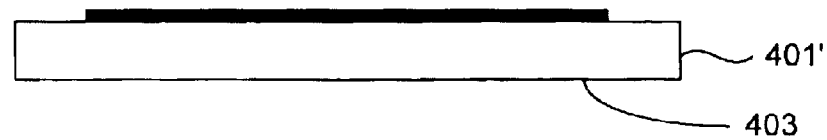
Figure 4C:
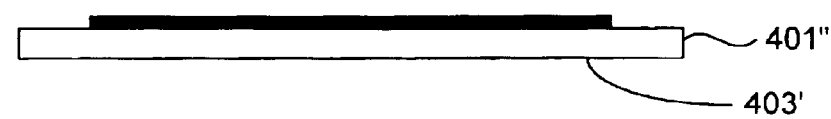
Figure 4D:
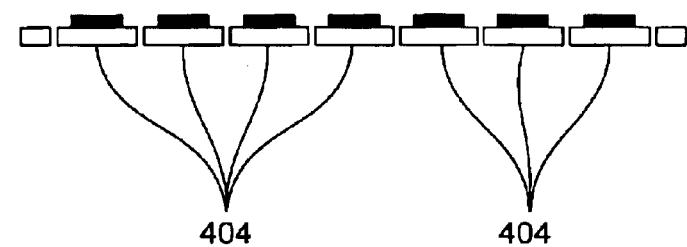

As depicted in FIG. 4(b), the wafer is then subjected to a bulk back-grinding process using any one of a number of conventional back-grinding processes. Portions of the backside surface 403 of the wafer 401' are removed to produce the resulting embodiment depicted in FIG. 4(b). In one embodiment, the backside surface is subjected to chemical mechanical polishing (CMP) to remove material from the backside of the wafer. Other methods of bulk material removal can also be used to remove material from the backside of the wafer. Typically, such back-grinding proceeds until the wafer is on the order of about $125\mu$ to about $175\mu$ thick. One preferred thickness is on the order of about $150\mu$ thick.

The wafer is then subjected to precision removal of backside material to reach a final desired thickness. In one embodiment depicted in FIG. 4(c), "plasma back-grinding" can be used to remove portions of the backside surface 403' of the wafer 401". Such precision removal of backside material continues until the wafer 401" is about $25\mu$ to about $100\mu$ thick. The actual thickness is dependent on the wafer material and the degree of flexibility and curvature desired in the final substrate. Many processes known to persons having ordinary skill in the art can be used to achieve precision removal of material from the backside surface 403' of the wafer 401". In one embodiment, atmospheric downstream plasma (ADP) etching is used to thin wafers 401" by precision removal of backside material. In one example process, a wafer having been subjected to bulk back-grinding is placed in a process chamber of an ADP etch system. For example, a TE-2001 series ADP machine available from Tru-Si Technologies of Sunnyvale, Calif. can be used. An argon flow of about 1 standard liter per minute (slm) is supplied along with a gas flow of suitable fluorine containing gases. Examples of suitable fluorine containing gases include $CF_4$, $SF_6$, as well as other fluorine containing gases. Suitable gas flow rates for the fluorine containing gases are about 4 slm to about 6 slm, but may vary with gas type chosen as well as other process needs. Such precision removal of backside material continues until the wafer 401" obtains the desired thickness.

One advantage of such precision removal of material (especially, when accomplished using plasma etching techniques) is that stresses induced during bulk backgrinding are relieved by such precision removal of material from the backside surface. Plasma etching does not induce stresses in the wafer. Another advantage of such precision removal of material (especially, with plasma etching) is that it can obtain extremely precise wafer thicknesses for the wafer 401".

In FIG. 4(*d*), the wafer is shown after singulation into a plurality of separate individual photoimager dies 404. Each die includes an image sensor. In some implementations, the process can conclude at this step having generated a plurality of flexible image sensors that can be used for, among other things, optical sensor modules having photoimager dies mounted on separate dies.

Figure 5A:
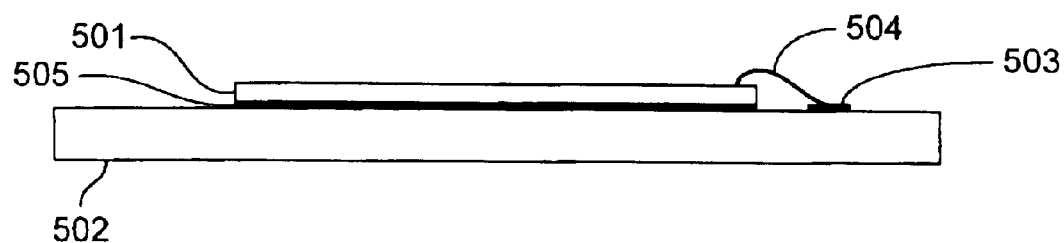
FIG. 5(a) is a cross-section view of a flexible substrate mounted on a flexible support in accordance with the principles of the present invention.
Figure 5B:
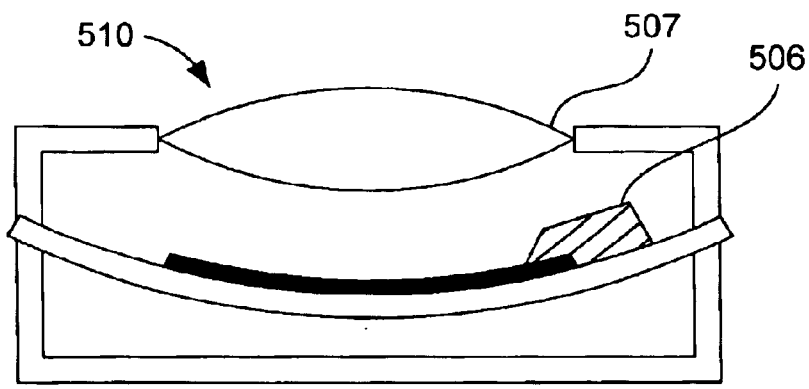
FIG. 5(b) is a cross-section view of an embodiment of an optical sensor module employing a flexible substrate mounted on a flexible support in accordance with the principles of the present invention.

Referring to FIG. 5(*a*) the forgoing embodiment can be further expanded upon. A flexible photoimager die (substrate) 501 is coupled with a flexible support 502. Such a support 502 provides a flexible support that increases the robustness of the substrate 501. In one embodiment, the support 502 can be formed of a polyimide material. Also, a laminated support 502 can be constructed having alternating layers of copper and polyimide materials. In broadest implementation, any material sufficiently flexible can be used as a support 502. An adhesive can be used to couple the substrate 501 with the flexible support 502. In one example, an epoxy layer 505 about 20µ to about 30µ thick can be used to attach the substrate 501 with the flexible support 502. The inventor contemplates using many other approaches known in the art for coupling the substrate 501 with the flexible support 502. Also, the support 502 can provide contact surfaces for electrical connections. In the depicted embodiment, the support 502 includes bonding surfaces 503 that can be electrically coupled to the circuitry of the substrate 501. For example, the bonding surfaces 503 can be wire-bonded to the substrate 501 using connector wires 504. The methods used for such electrical coupling are well known in the art.

FIG. 5(*b*) depicts one embodiment of an optical sensor module 510. For example, using the support 502 and substrate 501 of FIG. 5(*a*), the electrical connections are encapsulated by a protective layer 506 (e.g., a moisture resistant epoxy). The support 502 and substrate 501 are curved into a contour that matches a focal surface of a selected lens 507. Such lenses are typically low cost single element lenses formed of optical glasses or plastics. The support 502 and substrate 501 are optically coupled with the lens 507 and mounted in a protective housing 508. Thereby completing the fabrication of an optical sensor module embodiment in accordance with the principles of the present invention.

Figure 6:
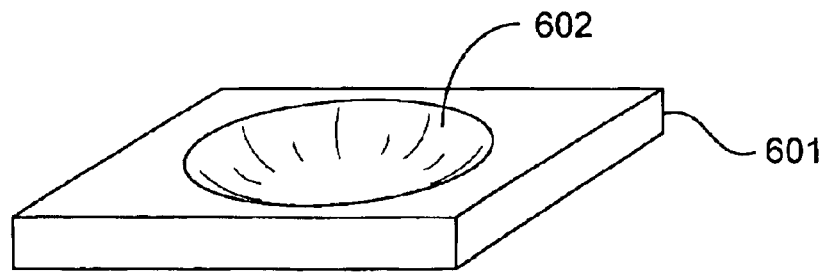
FIG. 6 is a perspective view of a rigid support having a preformed mounting surface with a curved mounting surface in accordance with the principles of the present invention.
Figure 7A:
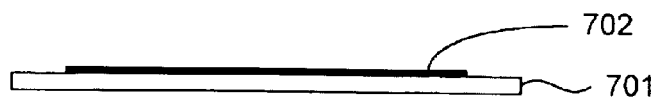
FIGS. 7(a)–7(d) are cross-section views of a process for mounting a flexible substrate on a curved mounting surface of a rigid support in accordance with the principles of the present invention. Also depicted is a cross-section view of an embodiment of an optical sensor module employing a rigid support in accordance with the principles of the present invention.
Figure 7B:
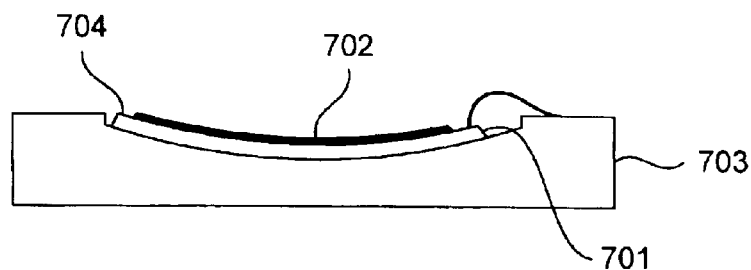
Figure 7C:
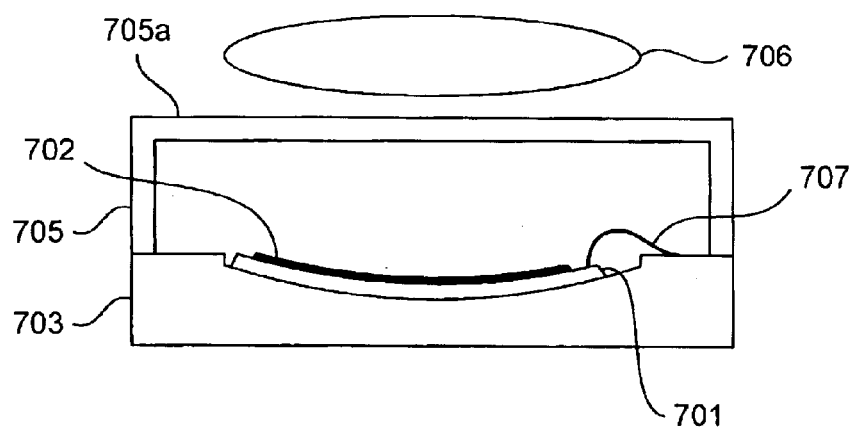
Figure 7D:
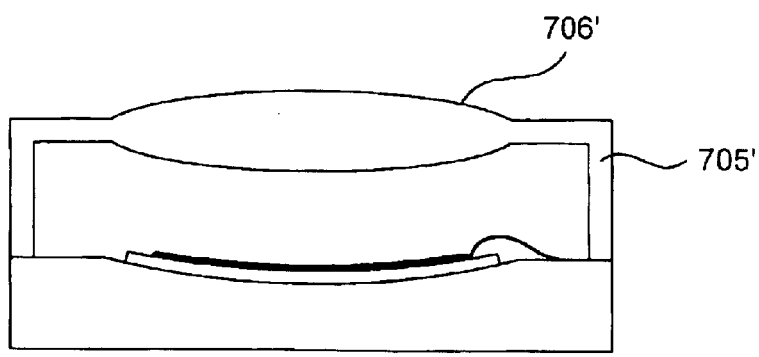

Another optical sensor module embodiment does not use a flexible support. Rather, this embodiment makes use of a rigid support structure having a curved surface portion of the rigid support. A typical embodiment of a rigid support structure 601 is shown in FIG. 6. The curved surface portion is depicted here as an indentation 602 having a circular shape with a surface contour defined by a radius of curvature. Other embodiments can assume a number of different shapes to accommodate many different types of lenses. In fact, the indentation can be replaced by a raised bump having a surface contour. Such rigid supports can be formed of a multitude of different materials including, but not limited to ceramics and plastics.

FIGS. 7(*a*)–7(*d*) are cross-section views that depict another embodiment of an optical sensor module of the present invention. FIG. 7(*a*) depicts a flexible photoimager die (substrate) 701 with optical circuitry 702 (e.g., a photo detector array) formed on a surface of the substrate 701. One example of such a substrate is depicted as 404 of FIG. 4(*d*).

In FIG. 7(*b*), the substrate 701 (with optical circuitry 702) is coupled with a rigid support 703. The rigid support 703 includes a curved surface portion 704. The curved surface portion 704 has a surface contour that is related to a curved focal surface of a chosen lens. In the depicted embodiment, the curved surface portion 704 of the rigid support 701 has a concave surface contour. Alternative embodiments can include convex surface contours. The surface contour of the curved surface portion 704 is configured so that a substrate 701 fitted on to the curved surface portion 704 obtains a surface configuration that substantially matches a focal surface of an associated lens. This principle is illustrated with respect to, for example, FIG. 3(*b*).

In the depicted implementation, the substrate 701 is coupled with the rigid support 703 using an adhesive. For example, an epoxy layer about 20µ to about 30µ thick can be used to attach the substrate 701 with the rigid support 703. The substrate 701 can also be coupled with the rigid support 703 using other coupling approaches.

The rigid support 703 can be electrically coupled to the circuitry of the substrate 701. For example, the substrate 701 can be wire-bonded to the support 703 using connector wires 707. As previously discussed, the methods used for such electrical coupling are well known in the art. If desired, the electrical connections can be encapsulated in a protective coating as discussed with respect to FIG. 5(*b*). Alternatively, the electrical connections can be enclosed within a housing (as shown below).

Referring to FIG. 7(*c*), the rigid support 703 and substrate 701 can be mounted inside a protective housing 705. The housing 705 includes an optically transmissive surface 705*a* (or window) through which light can pass onto the optical circuitry 702. A lens 706 can be mounted above the window 705*a* and above the substrate 701 at a desired optical distance from the optical circuitry 702 thereby optically coupling the lens 706 with the optical circuitry 702 and completing an optical imaging module. In a related embodiment, FIG. 7(*d*) depicts an optical imaging module wherein a lens 706' is an integral part of the housing 705'.

The present invention has been particularly shown and described with respect to certain preferred embodiments and specific features thereof. However, it should be noted that the above-described embodiments are intended to describe the principles of the invention, not limit its scope. Therefore, as is readily apparent to those of ordinary skill in the art, various changes and modifications in form and detail may be made without departing from the spirit and scope of the invention as set forth in the appended claims. Other embodiments and variations to the depicted embodiments will be apparent to those skilled in the art and may be made without departing from the spirit and scope of the invention as defined in the following claims. Further, reference in the claims to an element in the singular is not intended to mean "one and only one" unless explicitly stated, but rather, "one or more". Furthermore, the embodiments illustratively disclosed herein can be practiced without any element which is not specifically disclosed herein.

What is claimed is:

1. An optical sensor module comprising:

a sensor housing including sidewalls;

a lens mounted with the housing, the lens configured such that light passing through the lens has a curved focal surface; and a flexible substrate having optical circuitry formed on a surface thereof, wherein the substrate is formed sufficiently thin so that it can be flexed into a curved surface contour, the substrate being mounted with the housing in a flexed configuration and supported by the sidewalls of the housing thereby enabling the substrate to be flexed such that it obtains a curved surface contour that substantially corresponds to the curved focal surface of the lens.

2. The optical sensor module of claim 1 wherein the sensor housing includes a window opening; and wherein the lens is mounted in the window opening.

* * * * *